United States Patent
Boesch

[19]

[11] Patent Number: 6,137,826

[45] Date of Patent: Oct. 24, 2000

[54] DUAL-MODE MODULATION SYSTEMS AND METHODS INCLUDING OVERSAMPLING OF NARROW BANDWIDTH SIGNALS

[75] Inventor: Ronald D. Boesch, Morrisville, N.C.

[73] Assignee: Ericsson Inc., Research Triangle Park, N.C.

[21] Appl. No.: 08/971,502

[22] Filed: Nov. 17, 1997

[51] Int. Cl.[7] .................................................. H04L 27/30
[52] U.S. Cl. ........................ 375/146; 375/295; 375/298; 455/104
[58] Field of Search .................................... 375/146, 261, 375/269, 270, 259, 295, 298, 301, 277; 455/17, 22, 102, 104, 109, 61, 207; 332/108, 109, 119, 151, 158

[56] References Cited

U.S. PATENT DOCUMENTS

| | | | |
|---|---|---|---|
| 4,229,821 | 10/1980 | de Jager et al. ........................... | 375/53 |
| 4,812,786 | 3/1989 | Davarian et al. ....................... | 332/16 R |
| 5,248,970 | 9/1993 | Sooch et al. ............................. | 341/120 |
| 5,521,559 | 5/1996 | Ichihara .................................... | 332/117 |
| 5,530,722 | 6/1996 | Dent ......................................... | 375/298 |
| 5,548,616 | 8/1996 | Mucke et al. . | |
| 5,623,485 | 4/1997 | Bi ............................................. | 370/209 |
| 5,701,106 | 12/1997 | Pikkarainen et al. ................... | 332/100 |
| 5,764,692 | 6/1998 | Mucke ..................................... | 375/216 |
| 5,771,442 | 6/1998 | Wang et al. .............................. | 455/93 |
| 5,787,362 | 7/1998 | Matero .................................... | 455/553 |
| 5,825,829 | 10/1998 | Borazjani et al. ....................... | 375/308 |
| 5,867,537 | 2/1999 | Dent ........................................ | 375/298 |
| 5,867,763 | 2/1999 | Dean et al. .............................. | 455/5.1 |
| 5,872,810 | 2/1999 | Philips et al. ........................... | 375/222 |
| 5,881,376 | 3/1999 | Lundberg et al. ...................... | 455/226.1 |
| 6,006,108 | 12/1999 | Black et al. ............................. | 455/553 |
| 6,014,407 | 1/2000 | Hunsinger et al. ..................... | 375/206 |
| 6,032,028 | 2/2000 | Dickey et al. .......................... | 455/110 |

FOREIGN PATENT DOCUMENTS

| | | |
|---|---|---|
| 0 359 609 A1 | 3/1990 | European Pat. Off. . |
| 0 655 841 A1 | 5/1995 | European Pat. Off. . |
| WO 96/20540 | 7/1996 | WIPO . |

OTHER PUBLICATIONS

International Search Report, PCT/US98/23566, Mar. 31, 1999.

Candy and Temes, "Oversampling Methods for A/D and D/A Conversion," Oversampling Delta–Sigma Data Converters, IEEE Press, 1992, pp. 1–25.

*Primary Examiner*—Chi H. Pham
*Assistant Examiner*—Emmanuel Bayard
*Attorney, Agent, or Firm*—Myers Bigel Sibley & Sajovec

[57] ABSTRACT

A narrow bandwidth signal, such as a narrowband FM signal, is modulated in a modulator that modulates a wide bandwidth signal, such as a CDMA signal, by oversampling the narrow bandwidth signal and applying the oversampled narrow bandwidth signal to the modulator. By oversampling the narrow bandwidth signal, the same fixed low pass filter can be used for both the wide bandwidth signal and the oversampled narrow bandwidth signal. Accordingly, different low pass filters or switched low pass filters are not needed.

28 Claims, 2 Drawing Sheets

DUAL-MODE MODULATION SYSTEMS AND METHODS INCLUDING OVERSAMPLING OF NARROW BANDWIDTH SIGNALS

FIELD OF THE INVENTION

This invention relates to modulation systems and methods, and more particularly to dual-mode modulation systems and methods.

BACKGROUND OF THE INVENTION

Modulation systems and methods are widely used in transmitters to modulate an information input including voice and/or data onto a carrier. The carrier may be a final carrier or an intermediate carrier. The carrier frequency can be in UHF, VHF, RF, microwave or any other frequency band. Modulators are also referred to as "mixers" or "multipliers". For example, in a mobile radiotelephone, a modulator is used for the radiotelephone transmitter.

In modern communications systems, it is often desired to provide dual-mode modulation systems and methods that can modulate two types of communications signals. For example, in mobile radiotelephones, it is often important to provide a modulator that operates both in narrowband FM mode and in wideband Code Division Multiple Access (CDMA) mode. More particularly, in order to provide a mobile radiotelephone that can be used with both an IS-19 AMPS analog system and an IS-95 Direct Sequence Spread Spectrum (DSSS) wideband CDMA system, it is desirable to provide dual-mode modulation systems and methods.

Unfortunately, it may be difficult to provide a dual-mode modulation systems and methods that can handle the disparate bandwidths of the AMPS and CDMA signals. In particular, the narrowband AMPS FM signal has a bandwidth of about 12.5 KHz, while the wideband CDMA signal has a bandwidth of about 615 KHz, or about an order of magnitude wider.

In modem radiotelephone communications, mobile radiotelephones continue to decrease in size, cost and power consumption. In order to satisfy these objectives, it is generally desirable to share circuitry in dual-mode radiotelephones. Shared circuitry can decrease the number of components that are used in the modulator, thereby allowing a decrease in the size thereof. Shared components can also decrease the power consumption of the dual-mode modulation system, which can allow an increase in battery time. Finally, sharing of components can allow a decrease in component cost, thereby allowing a decrease in the overall cost of the radiotelephone.

FIG. 1 illustrates a first conventional dual-mode modulator. As shown in FIG. 1, an IQ modulator 10, also referred to as a "quadraphase modulator" or a "quadrature modulator" includes a quadrature splitter 20, also known as a 90° phase shifter, and a pair of multipliers 16a, 16b coupled to the quadrature splitter. A local oscillator 15, such as a Voltage Controlled Oscillator (VCO), is coupled to the quadrature splitter 20 to produce 90° phased shifted local oscillator signals. I data 11a and Q data 11b are coupled to a respective multiplier or mixer 16a, 16b respectively. Digital input data is converted to analog data by I Digital-to-Analog Converter (DAC) 14a and Q DAC 14b, respectively. The outputs of the DACs 14a and 14b respectively are applied to low pass filters 12a and 12b respectively to provide the I and Q data inputs 11a and 11b respectively. The modulator modulates the input data on a carrier 13, by summing the outputs of the multipliers 16a, 16b at summing node 218, and transmits the modulated carrier 13 via an antenna.

The DACs 14a and 14b, low pass filters 12a and 12b and IQ modulator 10 may be used to modulate a high bandwidth CDMA signal such as a Direct Sequence Spread Spectrum (DSSS) signal onto a carrier. Since the signal is generated digitally, it is low pass filtered by filters 12a and 12b to let the information through while removing digitally generated spurs and noise.

In order to use the IQ modulator 10 of FIG. 1 in a dual-mode, such as for narrow bandwidth FM signal, a separate FM DAC 19 and a separate FM low pass filter 17 may be provided. Baseband circuitry generates an FM voltage signal that is applied to the tune line of the VCO, to modulate the FM information onto the carrier for transmission according to the AMPS standard. Since the FM voltage signal is generated digitally, it is low pass filtered by FM low pass filter 17 to let the information through while removing digitally generated spurs and noise.

The low pass filter 17 generally has a different bandpass characteristic than the low pass filters 12a and 12b that are part of the CDMA modulator, due to the widely differing bandwidths of the FM and CDMA signals. Accordingly, in this dual-mode embodiment, a separate FM DAC 19 and a separate FM low pass filter 17 is provided. Modulation systems according to FIG. 1 have been designed into many integrated circuit chip sets developed for CDMA standards that also include AMPS functionality. Unfortunately, this technique uses separate DACs and low pass filters, which may increase the size, cost and/or power consumption of the modulator.

A second dual-mode modulation system is illustrated in FIG. 2. In this figure, an IQ modulator 210 including a quadrature splitter 220, a pair of multipliers 216a and 216b, a summing node 218 and a VCO 215 are provided to produce a modulated carrier 213. However, in contrast with FIG. 1, the DACs and low pass filters are shared for the dual-mode operation. In particular, the I DAC and Q DAC 214a and 214b respectively are used for both wideband CDMA and narrowband FM operation. Low pass filters 212a and 212b are also used for wideband CDMA and narrowband FM operation.

Unfortunately, due to the widely disparate bandwidths of the CDMA signal and the FM signal, the low pass filters 212a and 212b should have different band pass characteristics when in the different modes. In order to share the low pass filter, the band pass frequency is switched depending upon mode. Accordingly, while these switched filters 212a, 212b are used in both modes, they may be expensive to implement and may consume excessive power and/or area in a radiotelephone.

SUMMARY OF THE INVENTION

It is therefore an object of the present invention to provide improved dual-mode modulation systems and methods.

It is another object of the present invention to provide dual-mode modulation systems and methods for a first signal and a second signal of narrower bandwidth than the first signal.

It is still another object of the present invention to provide dual-mode modulation systems and methods for a first signal and a second signal of narrower bandwidth than the first signal, that can share components of the modulation system to provide compact, low cost and/or low power dual-mode modulation.

These and other objects are provided, according to the present invention, by modulating a narrow bandwidth signal, such as a narrowband FM signal, in a modulator that modulates a wide bandwidth signal, such as a CDMA signal, by oversampling the narrow bandwidth signal and applying the oversampled narrow bandwidth signal to the modulator. By oversampling the narrow bandwidth signal, the same fixed low pass filter can be used for both the wide bandwidth signal and the oversampled narrow bandwidth signal. Accordingly, different low pass filters or switched low pass filters are not needed.

In a particular aspect of the present invention, a CDMA modulator including a sampler is used for dual-mode modulation by applying a narrow bandwidth FM signal to the CDMA modulator, such that the CDMA modulator oversamples the FM signal and modulates the oversampled FM signal. The CDMA modulator includes a fixed low pass filter having a passband that encompasses a CDMA signal and the oversampled FM signal, so that the same fixed low pass filter is used to filter both the CDMA signal and an FM signal. The CDMA modulator may be particularly useful in a radiotelephone where the CDMA signal may be a direct sequence spread spectrum signal and the FM signal may be an analog cellular telephone signal.

Dual-mode modulation systems according to the present invention include means for modulating an applied signal onto a carrier and means for applying a first signal to the modulating means, to thereby modulate the first signal onto a carrier. Oversampling means is included for oversampling a second signal of narrower bandwidth than the first signal. The systems also include means for applying the oversampled second narrower bandwidth signal to the modulating means, to thereby modulate the second narrower bandwidth signal onto a carrier.

The modulating means preferably comprises a digital-to-analog converter and a low pass filter that filters the analog output of the digital-to-analog converter, wherein the low pass filter has a passband that encompasses the first signal, and the oversampled second narrower bandwidth signal, such that the same fixed low pass filter is used to filter both the first signal and the oversampled second narrower bandwidth signal. When the modulating means comprises an IQ modulator having I and Q inputs, the oversampling means preferably comprises first and second samplers.

Dual-mode modulation systems according to the invention also include means for sampling an applied signal, means for converting the sampled signal to an analog signal, means for low pass filtering the analog signal and means for modulating the low pass filtered analog signal onto a carrier. Dual-mode modulation systems also include means for applying a first signal to the sampling means, to thereby modulate the first signal on a carrier using the sampling means, the converting means and the low pass filtering means, and for applying a second signal of narrower bandwidth than the first signal to the sampling means, to thereby oversample the second signal and modulate the second signal on a carrier using the sampling means, the converting means and the low pass filtering means. Accordingly, the same unswitched filters may be used for both the wide and narrow bandwidth signals, to thereby allow reduction in cost, space and/or power consumption.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3:
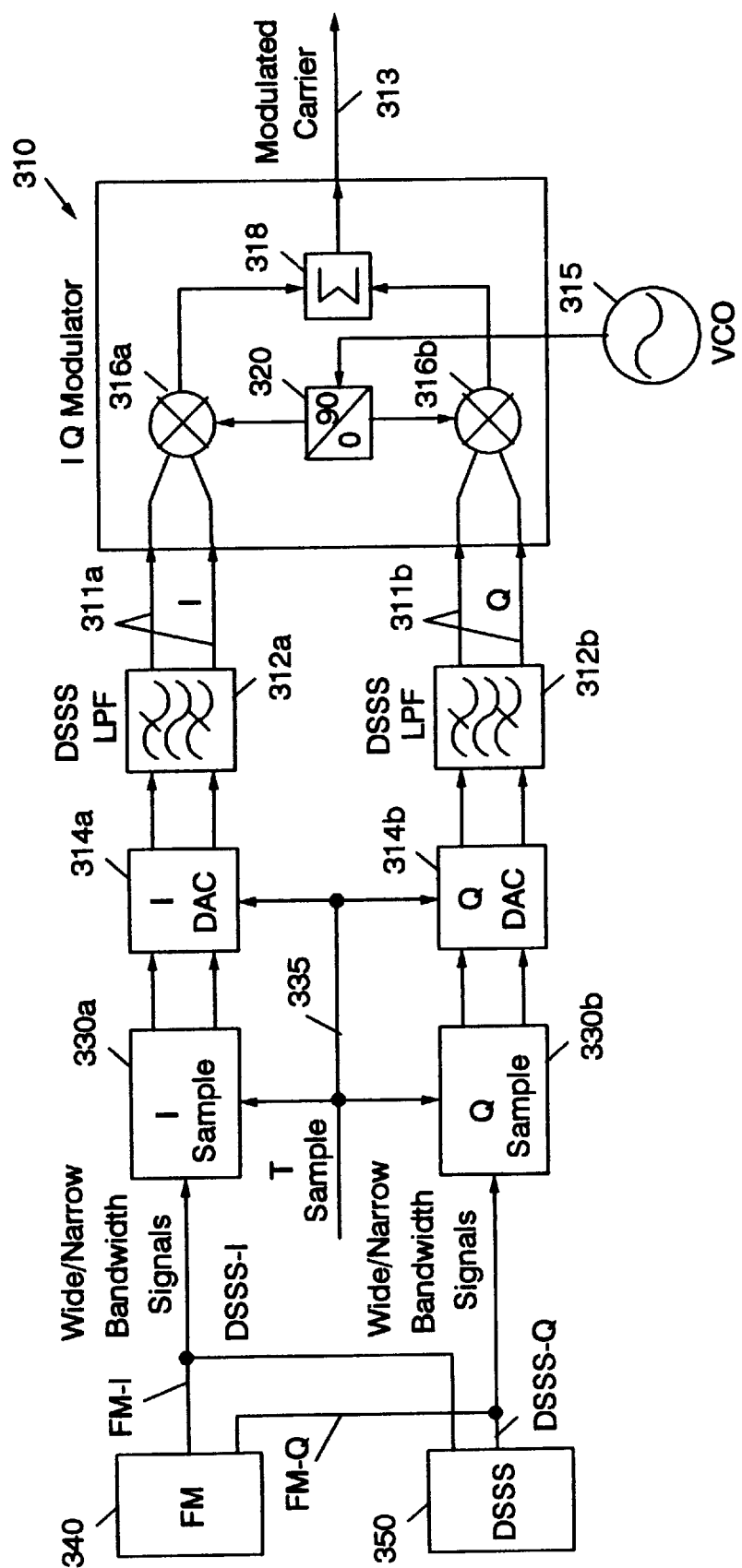
FIG. 3 is a block diagram of dual-mode modulation systems and methods according to the present invention.

Referring now to FIG. 3, a block diagram of dual-mode modulation systems and methods according to the invention is shown. As shown in FIG. 3, dual-mode modulation systems and methods include an IQ modulator 310 that includes a VCO 315, a pair of multipliers 316a and 316b, a quadrature splitter 320 and a summing node 318. The interconnection of these elements to form a quadrature modulator are well known to those having skill in the art, and need not be described further herein. As also shown, IQ modulator 310 accepts I inputs 311a and Q inputs 311b and produces an output 313 that modulates these inputs on a carrier.

Still referring to FIG. 3, dual-mode modulation systems and methods according to the invention include a pair of fixed low pass filters 312a and 312b. The fixed low pass filters include a passband which can pass the wide bandwidth signals, such as the CDMA DSSS signals. An I DAC 314a and a Q DAC 314b are also included.

Still referring to FIG. 3, also included is a pair of samplers 330a and 330b, also referred to as an I sampler and a Q sampler, respectively. According to the invention, and as shown in FIG. 3, a source of wide bandwidth signals, such as DSSS signal source 350 and a source of narrow bandwidth signals, such as FM signal source 340 are both applied to the samplers 330a and 330b. DSSS signal source 350 may produce a DSSS-I signal and DSSS-Q signal that are applied to sampler 330a and sampler 330b respectively. FM signal source 330 may produce an FM I signal and an FM Q signal that are applied to the I sampler 330a and the Q sampler 330b respectively. It will be understood that DSSS signal source 350 and FM signal source 340 may be generated as baseband signals in dual-mode radiotelephones. The generation of DSSS signals and FM signals in dual-mode radiotelephones are well known to those having skill in the art and need not be described further herein.

Still referring to FIG. 3, it can be seen that the samplers 330a and 330b and the DACs 314a and 314b operate at a sample rate $T_{sample}$. The sample rate $T_{sample}$ may be controlled by a signal that is applied to control line 335. The sample rate is generally set by the sample rate for the wide bandwidth signals 350. Accordingly, when the narrow bandwidth signals 340 are applied to samplers 330a and 330b, the sampler acts to oversample the narrow bandwidth signals. By oversampling the narrow bandwidth signals, the same DACs and low pass filters 314 and 312 respectively, may be used for the wide and narrow bandwidth signals.

It will be understood that as part of the wide bandwidth signal modulation, the wide bandwidth signals also may be oversampled by samplers 330a and 330b. In that case, the narrow bandwidth signals are highly oversampled by samplers 330a and 330b. It will also be understood that the sample rate need not be identical for the wide and narrow bandwidth signals. However, the sample rate $T_{sample}$ is generally maintained at a rate such that the same fixed low pass filters 312a and 312b can be used for the wide and narrow bandwidth signals. Accordingly, a dual-mode modulator may use the same unswitched low pass filters for modulating the wide bandwidth signals and the oversampled narrow bandwidth signals, to thereby save cost, space and/or power.

The present invention can use the same fixed low pass filter (without switching) for both the FM signal and spread spectrum signal fed into the IQ modulator. Variable low pass filters, such as switched low pass filters, are not needed. In order to use the same fixed low pass filter, the FM signal is highly oversampled in the DAC, preferably at the same sample rate, $T_{sample}$, as the spread spectrum signal. To be sampled at this rate in the DAC, it is upsampled/interpolated to this highly oversampled rate.

For an IS-95 signal, the sample rate can be 8× or 4.9152 MHz. For convenience, the sample rate for the FM signal can be a divider of a reference clock rate that is near the IS-95 sample rate (19.2 MHz/4 or 4.8 MHz). The sampling spur (~5 MHz) can be reduced by the low pass filter to meet the spur performance specifications of the transmitter for both AMPS and CDMA.

Figure 1:
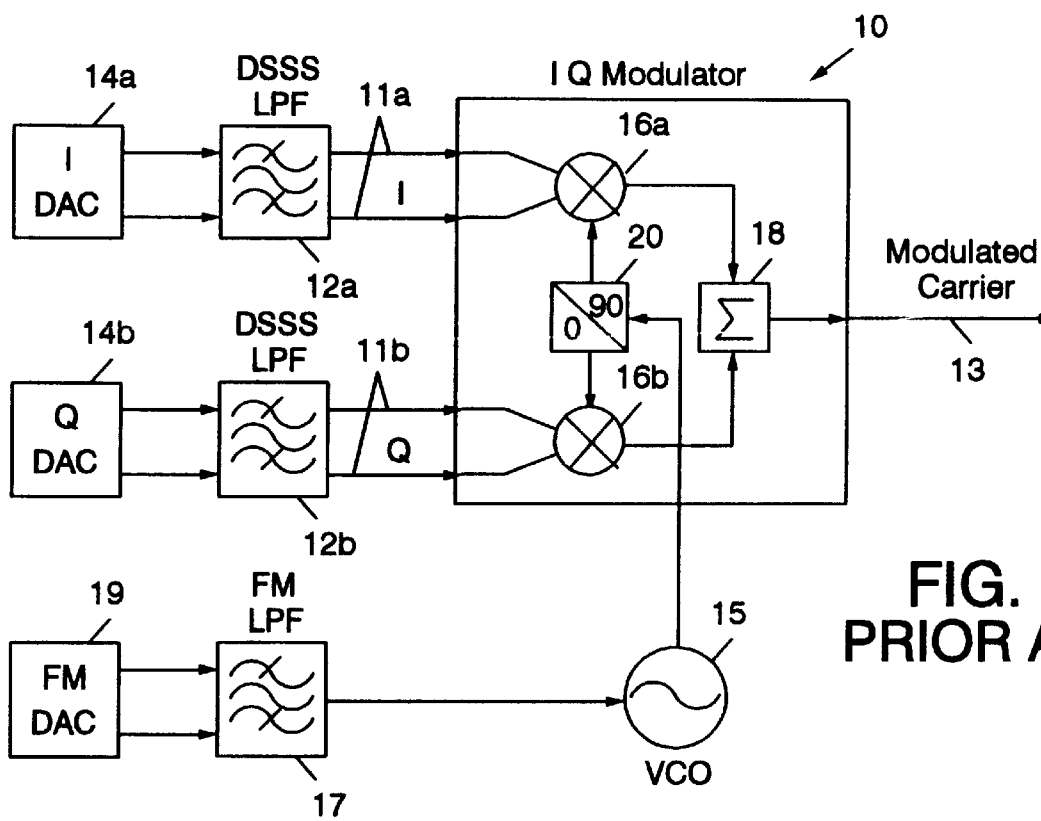
FIG. 1 is a block diagram of a first conventional dual-mode modulation system and method.
Figure 2:
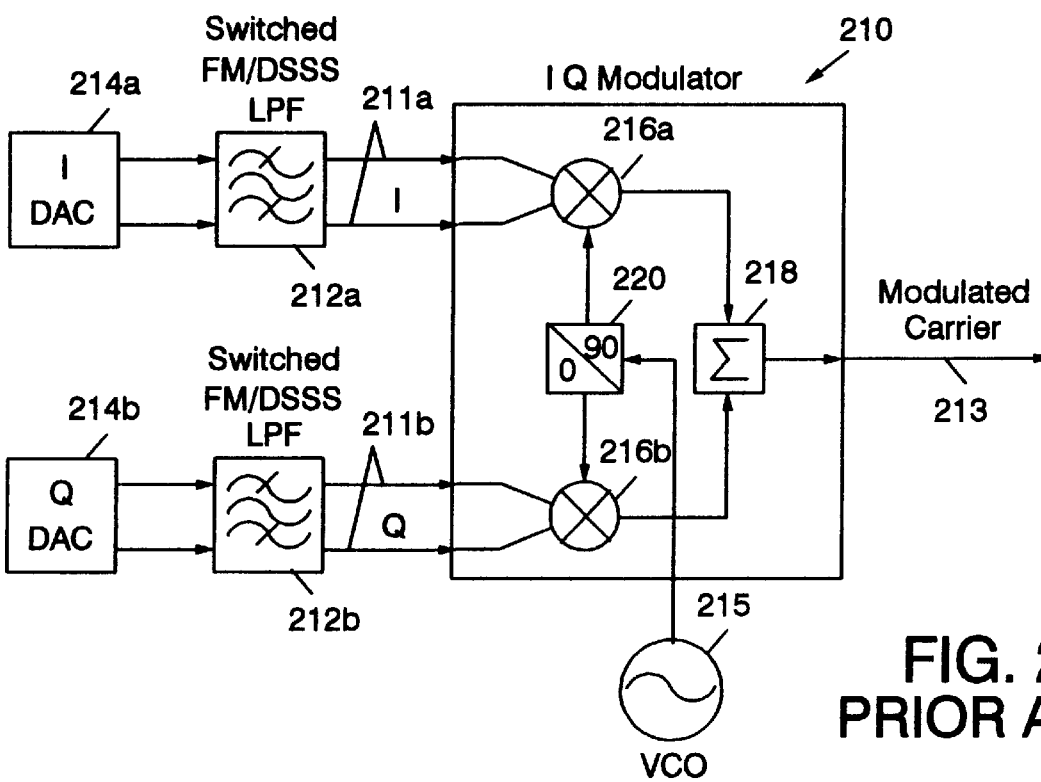
FIG. 2 is a block diagram of a second conventional dual-mode modulation system and method.

By highly oversampling the FM signal, the sampling noise floor from the DAC can be decreased to acceptable levels for the AMPS transmission (<−60 dBc). The spread spectrum signal is not highly oversampled, rather it is normally oversampled (8×). The sampling noise floor for the DAC for this mode can be decreased to acceptable levels for the IS-95 transmission (<−45 dBc). The spurious free dynamic range for either mode is preferably greater than the difference between the largest signal and the noise floor (>60 dB for AMPS and >45 dB for CDMA). Thus, the quality of the IQ modulator is preferably sufficient to meet the modulation specifications in the AMPS mode, which are generally more severe than the CDMA mode. This is also the case for a conventional system of FIG. 2, where the IQ modulator is shared and the low pass filter is switched.

The present invention may be applied to modulation systems and methods that share an IQ modulator with an FM signal (narrow bandwidth) and a direct sequence spread spectrum signal (wide bandwidth). The analog FM signal is converted to a digital signal at some rate. If the converted rate is low, then it can be upsampled/interpolated to the final desired rate, $T_{sample}$. During A/D conversion, it can immediately be highly oversampled at the final desired rate. The present invention may also be applied to modulation systems and methods that share an IQ modulator with an unspread digital signal (narrow bandwidth) and a direct sequence spread spectrum signal (wide bandwidth). Thus, the present invention may be used in mixed AMPS/CDMA radiotelephones (IS-95), mixed GSM/WCDMA radiotelephones (third generation wideband cellular standards), and other radiotelephones that combine wideband and narrowband signals.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A dual-mode modulation system that alternatingly modulates a first signal and a second signal of narrower bandwidth than the first signal in a first modulation mode and in a second modulation mode, respectively, the dual-mode modulation system comprising:

shared means for modulating an applied signal onto a carrier;

means for applying the first signal to the shared modulating means in the first modulation mode, to thereby modulate the first signal onto a carrier;

means for oversampling the second narrower bandwidth signal; and means for applying the oversampled second narrower bandwidth signal to the modulating means in the second modulation mode, to thereby modulate the second narrower bandwidth signal onto a carrier.

2. A dual-mode modulation system according to claim 1:

wherein the shared modulating means comprises a shared digital-to-analog converter and a shared low pass filter that filters the analog output of the shared digital-to-analog converter; and wherein the shared low pass filter has a passband that encompasses the first signal and the oversampled second narrower bandwidth signal, such that the shared low pass filter is used to filter both the first signal in the first modulation mode and the oversampled second narrower bandwidth signal in the second modulation mode.

3. A dual-mode modulation system according to claim 1 wherein the first signal is a CDMA signal and wherein the second signal is an FM signal, to thereby provide a dual-mode CDMA/FM modulation system.

4. A dual-mode modulation system according to claim 3 wherein the CDMA signal is a direct sequence spread spectrum signal and wherein the FM signal is an analog cellular telephone signal.

5. A dual-mode modulation system according to claim 1:

wherein the shared modulating means comprises a shared IQ modulator including I and Q inputs; and wherein the oversampling means comprises first and second samplers, the first sampler being responsive to the I input and the second sampler being responsive to the Q input.

6. A dual-mode modulation system comprising:

shared means for sampling an applied signal;

shared means for converting the sampled signal to an analog signal;

shared means for low pass filtering the analog signal;

shared means for modulating the low pass filtered analog signal onto a carrier; and means for applying a first signal to the shared sampling means in a first modulation mode, to thereby modulate the first signal on a carrier using the shared sampling means, the shared converting means and the shared low pass filtering means, and for applying a second signal of narrower bandwidth than the first signal to the shared sampling means in a second modulation mode that alternates with the first modulation mode, to thereby sample the second signal and modulate the second signal on a carrier using the shared sampling means, the shared converting means and the shared low pass filtering means.

7. A dual-mode modulation system according to claim 6 wherein the shared low pass filtering means is a shared fixed low pass filter having a passband that encompasses the sampled first signal and the sampled second narrower bandwidth signal, such that the shared fixed low pass filter is used to filter both the first signal in the first modulation mode and the second narrower bandwidth signal in the second modulation mode.

8. A dual-mode modulation system according to claim 6 wherein the first signal is a CDMA signal and wherein the second signal is an FM signal, to thereby provide a dual-mode CDMA/FM modulation system.

9. A dual-mode modulation system according to claim 8 wherein the CDMA signal is a direct sequence spread spectrum signal and wherein the FM signal is an analog cellular telephone signal.

10. A dual-mode modulation system according to claim 6:
wherein the shared modulating means comprises a shared IQ modulator having I and Q inputs; and
wherein the shared sampling means comprises first and shared second samplers, the first shared sampler being responsive to the I input and the second shared sampler being responsive to the Q input.

11. A dual-mode radiotelephone that alternatingly operates in a first mode and in a second mode, the dual-mode radiotelephone comprising:
shared means for modulating an applied signal onto a carrier;
means for generating a first radiotelephone signal in the first mode and applying the first radiotelephone signal to the shared modulating means, to thereby modulate the first radiotelephone signal onto a carrier in the first mode;
means for generating a second radiotelephone signal of narrower bandwidth than the first radiotelephone signal in the second mode;
means for oversampling the second narrower bandwidth radiotelephone signal; and means for applying the oversampled second narrower radiotelephone bandwidth signal to the shared modulating means in the second mode, to thereby modulate the second narrower bandwidth radiotelephone signal onto a carrier in the second mode.

12. A dual-mode radiotelephone according to claim 11:
wherein the shared modulating means comprises a shared digital-to-analog converter and a shared fixed low pass filter that filters the analog output of the shared digital-to-analog converter; and
wherein the shared fixed low pass filter has a passband that encompasses the first radiotelephone signal and the oversampled second narrower bandwidth radiotelephone signal, such that the shared fixed low pass filter is used to filter both the first radiotelephone signal in the first mode and the oversampled second narrower bandwidth radiotelephone signal in the second mode.

13. A dual-mode radiotelephone according to claim 11 wherein the first radiotelephone signal is a CDMA signal and wherein the second radiotelephone signal is an FM signal, to thereby provide a dual-mode CDMA/FM radiotelephone.

14. A dual-mode radiotelephone according to claim 13 wherein the CDMA signal is a direct sequence spread spectrum signal and wherein the FM signal is an analog cellular telephone signal.

15. A dual-mode radiotelephone according to claim 11:
wherein the shared modulating means comprises a shared IQ modulator including I and Q inputs; and
wherein the oversampling means comprises first and second samplers, the first sampler being responsive to the I input and the second sampler being responsive to the Q input.

16. A dual-mode radiotelephone that alternatingly operates in a first mode and in a second mode, the dual-mode radiotelephone comprising:
shared means for sampling an applied signal;
shared means for converting the sampled signal to an analog signal;
shared means for low pass filtering the analog signal;
shared means for modulating the low pass filtered analog signal onto a radiotelephone carrier;
means for generating a first radiotelephone signal in the first mode and a second radiotelephone signal of narrower bandwidth than the first radiotelephone signal in the second mode; and
means for applying the first radiotelephone signal to the shared sampling means in the first mode, to thereby modulate the first radiotelephone signal on a carrier using the shared sampling means, the shared converting means, the shared low pass filtering means and the shared modulating means in the first mode, and for applying the second radiotelephone signal of narrower bandwidth than the first radiotelephone signal to the sampling means in the second mode, to thereby sample the second radiotelephone signal and modulate the second radiotelephone signal on a carrier using the shared sampling means, the shared converting means, the shared low pass filtering means and the shared modulating means in the second mode.

17. A dual-mode radiotelephone according to claim 16 wherein the shared low pass filtering means is a shared fixed low pass filter having a passband that encompasses the sampled first signal and the sampled second narrower bandwidth signal, such that the shared fixed low pass filter is used to filter both the first radiotelephone signal in the first mode and the second narrower bandwidth radiotelephone signal in the second mode.

18. A dual-mode radiotelephone according to claim 16 wherein the first radiotelephone signal is a CDMA signal and wherein the second radiotelephone signal is an FM signal, to thereby provide a dual-mode CDMA/FM radiotelephone.

19. A dual-mode radiotelephone according to claim 18 wherein the CDMA signal is a direct sequence spread spectrum signal and wherein the FM signal is an analog cellular telephone signal.

20. A dual-mode radiotelephone according to claim 16:
wherein the shared modulating means comprises a shared IQ modulator having I and Q inputs; and
wherein the shared sampling means comprises first and second shared samplers, the first shared sampler being responsive to the I input and the second shared sampler being responsive to the Q input.

21. A dual-mode modulation method for a CDMA modulator including a sampler, the dual-mode modulation method comprising the step of:
alternatingly applying a narrow bandwidth FM signal and a CDMA signal to the CDMA modulator such that the CDMA modulator oversamples the narrow bandwidth FM signal and modulates the oversampled narrow bandwidth FM signal, to thereby provide a dual-mode CDMA/FM modulator from the CDMA modulator.

22. A method according to claim 21 wherein CDMA modulator includes a fixed low pass filter having a passband that encompasses a CDMA signal and the oversampled FM signal, such that the fixed low pass filter is used to filter both a CDMA signal and the oversampled FM signal.

23. A method according to claim 22 wherein the CDMA modulator is a direct sequence spread spectrum modulator and wherein the FM signal is an analog cellular telephone signal.

24. A method according to claim 21:

wherein the CDMA modulator comprises an IQ CDMA modulator having I and Q inputs; and wherein the sampler comprises first and second samplers, the first sampler being responsive to the I input and the second sampler being responsive to the Q input.

25. A method for modulating a second signal in a modulator that modulates a first signal, the second signal having narrower bandwidth than the first signal, the modulation method comprising the steps of:

oversampling the second signal; and alternatingly applying the first signal and the oversampled second signal to the modulator, to thereby provide a dual-mode modulator from the modulator that modulates a first signal.

26. A method according to claim 25 wherein the modulator includes a fixed low pass filter having a passband that encompasses the first signal and the oversampled second signal, such that the fixed low pass filter is used to filter both the first signal and the oversampled second signal.

27. A method according to claim 25 wherein the first signal is a CDMA signal and wherein the second signal is an FM signal, to thereby provide a dual-mode CDMA/FM modulator.

28. A method according to claim 27 wherein the CDMA signal is a direct sequence spread spectrum signal and wherein the FM signal is an analog cellular telephone signal.

* * * * *